United States Patent [19]

Molnar

[11] 4,156,234

[45] May 22, 1979

[54] DIGITAL ANGLE TO RESOLVER/SYNCHRO CONVERTER

[75] Inventor: Kálmán Molnár, Freiburg, Fed. Rep. of Germany

[73] Assignee: Hellige GmbH, Freiburg, Fed. Rep. of Germany

[21] Appl. No.: 903,362

[22] Filed: May 5, 1978

[51] Int. Cl.² .............................................. H03K 13/02
[52] U.S. Cl. ...................... 340/347 SY; 340/347 DA; 364/603
[58] Field of Search .... 340/347 M, 347 SY, 347 DA; 328/14; 364/603, 817, 818; 318/604, 605

[56] References Cited

PUBLICATIONS

Hodges, "IBM Technical Disclosure Bulletin," vol. 12, No. 10, Mar. 1970, pp. 1639–1640.

*Primary Examiner*—Charles D. Miller
*Attorney, Agent, or Firm*—Norman E. Brunell; W. R. Thiel

[57] ABSTRACT

A digital angle to resolver/synchro converter is disclosed which utilizes the tangent of the input angle in a unique feedback loop.

5 Claims, 1 Drawing Figure

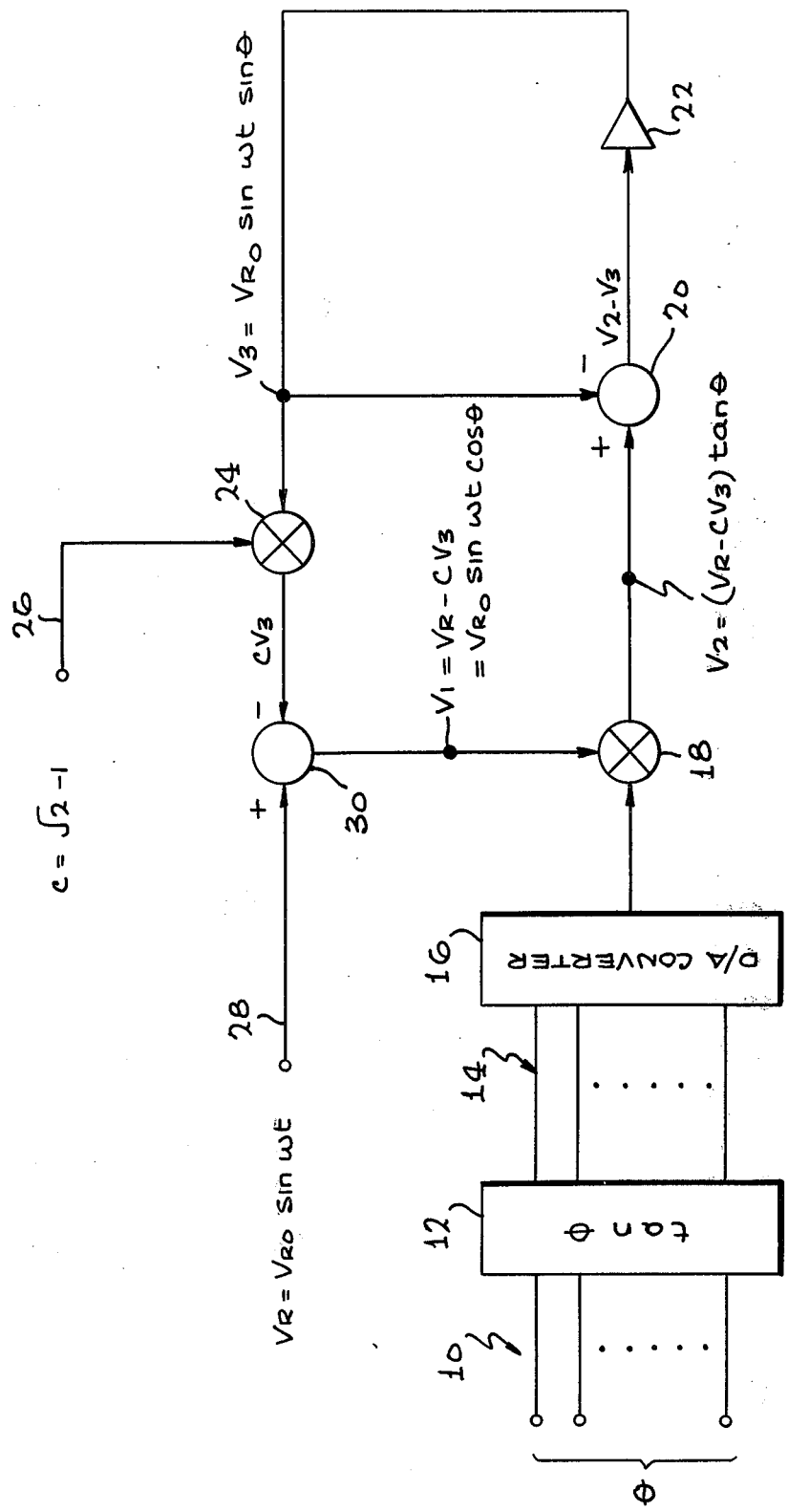

DIGITAL ANGLE TO RESOLVER/SYNCHRO CONVERTER

BACKGROUND OF THE INVENTION

1. Field of the Invention

This invention relates generally to digital electronic circuitry for generating a periodic function of an input. In particular this invention relates to digital angle to resolver/synchro converter circuits.

Synchros are typically used to transmit position data. The input position signals, referred to herein as the rotor-stator rotation angle $\theta$, are applied to the shaft of a synchro transmitter and transmitted over a three-wire system to a synchro receiver, the shaft of which is thereby positioned at the proper angular position $\theta$. Although four-wire resolver data transmission systems similar to three-wire synchro data transmission systems are feasible, resolvers are used mainly for trigonometric computation such as the conversion of polar to rectangular coordinates or the rotation of rectangular coordinates. Three-wire synchro format data may be transformed into four-wire resolver format data and vice versa by various known devices, such as "Scott-T" transformers. The resolver is so named because it can resolve an input position into two output voltages which vary as the sine and cosine of the rotor-stator rotation angle $\theta$. The output equations of a resolver having one stator winding energized by an AC voltage equal to A sin $\omega t$ are A sin $\omega t$ sin $\theta$ and A sin $\omega t$ cos $\theta$, assuming that the rotor-stator transfer functions are equaled to one.

It is particularly convenient to utilize resolvers and synchros in digital electronic circits. It is therefore often necessary to convert between digital format and resolver or synchro format by means of digital angle to resolver/synchro converters.

Octant normalization is a known technique for reducing the complexity of required signal processing. The input angle $\theta$ is normalized per octant so that the input signal range is normalized from a range of $0° \leq \theta \leq 360°$ to a range of $0° \leq \theta \leq 45°$.

2. Description of the Prior Art

Analog periodic function generators, both mechanical and electrical, are well known in the art. Such devices are relatively complicated, require constant adjustment, are usually relatively large and subject to degradation by the environment. A digital electronic approach is attractive because of the inherent accuracy, stability, small size and dependability of digital circuitry.

The generation of a periodic function, such as the tangent of an angle, can be accomplished by means of a tangent table stored in a memory such as a Read Only Memory or ROM.

Digital to resolver/synchro converters are known which utilize electronic circuitry such as the DSC series of converters described in the Analog Devices, Inc., Product Guide of Jan. 19, 1975, which use sine and cosine multiplication. Similar devices are shown in the 1975 Data Device Corporation catalogue.

SUMMARY OF THE INVENTION

My digital angle to resolver/synchro converter provides resolver format output signals which are sine and cosine terms of the digital input angle information. If synchro format data output signals are required, the known resolver to synchro conversion techniques are used. The input signal is a digital representation of an octant normalized angle. A tangent generator is utilized in a feedback loop to generate the following output voltages:

$$V_3 = \frac{\tan \theta}{1 + C\tan \theta} V_R$$

$$V_1 = \frac{1}{1 + C\tan \theta} V_R$$

$V_R$ is the reference input voltage and C is a constant such that $$V_R = V_{RO} \sin \omega t$$

$$C = \sqrt{2} - 1.$$

In this manner $V_3$ and $V_1$ represent approximations of the sine and cosine terms which are:

$$\sin \theta = \frac{\tan \theta}{\sqrt{1 + \tan^2 \theta}}$$

$$\cos \theta = \frac{1}{\sqrt{1 + \tan^2 \theta}}$$

The ratio of these voltages, i.e. $V_3$ to $V_1$ is equal to tan $\theta$. Although the sine and cosine terms, $V_3$ and $V_1$, are approximations, they do meet the practical requirements for most digital to resolver/synchro converters.

BRIEF DESCRIPTION OF THE DRAWING

The FIGURE is a schematic representation of a digital angle to resolver/synchro converter according to my invention.

DETAILED DESCRIPTION OF THE PREFERRED EMBODIMENT

The FIGURE is a schematic representation of a digital angle to resolver/synchro converter.

Octant normalized, digital input angle $\theta$ is presented on signal lines 10 to digital tangent function generator 12 of any conventional design, the output of which is tan $\theta$ appearing on signal lines 14. Tan $\theta$ is applied to the input of digital-to-analog converter 6, the output of which is applied to multiplier 18. The output of multiplier 18 is signal $V_2$. Signal $V_3$ is subtracted from $V_2$ in subtractor 20, the output of which is applied as an input to high gain amplifier 22. The output of amplifier 22 is $V_3$. $V_3$ is also applied to multiplier 24, the other input of which is reference signal C applied on signal line 26. The output of multiplier 24 is subtracted from reference input $V_R = V_{RO} \sin \omega t$ on line 28 in subtractor 30. The output of subtractor 30 is $V_1$ which is applied as an input to multiplier 18. As an alternative, a multiplying digital-to-analog converter such as the type DAC 348 from Hybrid Systems Corporation or MN 412 from Micro Networks Corporation can be used in substitution for converter 16 and multiplier 18.

The operation of this digital angle to resolver/synchro converter can be best understood by reference to the equation of the circuit of the FIGURE:

$$(V_R - CV_3) \tan \theta - V_3 = V_3/A.$$

Operational amplifier 22 has a very high gain factor A so that the right hand side of the circuit equation is equal to zero to a very close approximation. This results in the equations:

$$V_1 = \frac{1}{1 + C\tan\theta} V_R \approx V_{RO} \sin\omega t \cos\theta$$

$$V_3 = \frac{\tan\theta}{1 + C\tan\theta} V_R \approx V_{RO} \sin\omega t \sin\theta$$

$V_1$ is therefore an approximation of the cosine $\theta$ term and $V_3$ is an approximation of the sine $\theta$ term. Nevertheless, the ratio of $V_3$ to $V_1$ is exactly equal to $\tan\theta$ so that even though they are only approximations, the voltages $V_3$ and $V_1$ meet most of the practical requirements for the output of a digital to resolver/synchro converter. The constant value C is equal to $\sqrt{2}-1$. If C differs from this value, the deviation will not affect the accuracy of the output signal ratio, and results only in a less good approximation of the sine and cosine terms. It should be noted that $V_2$ is approximately equal to $V_3$.

I claim:

1. Apparatus for converting digital format angle information to resolver format information having sine and cosine terms, comprising:

first means to generate a signal related to the tangent of the digital format angle information;

second means to multiply the tangent signal by the cosine term;

third means responsive to the multiplier means for subtracting the sine term from the output thereof;

a high gain amplifier responsive to the third means to generate the sine term; and fourth means to combine the sine term with a sinusoidally varying reference to generate the cosine term.

2. The apparatus claimed in claim 1, wherein the fourth means includes:

fifth means for multiplying the sine term by a constant value C before combining with the reference.

3. The apparatus of claim 2, wherein C has the value of $\sqrt{2}-1$.

4. The apparatus of claim 1, wherein the first means includes:

a digital tangent function generator; and a digital-to-analog converter connected thereto.

5. The apparatus of claim 1, wherein the second means includes:

a digital-to-analog converter.

* * * * *